United States Patent
Arora

(10) Patent No.: US 7,764,094 B1
(45) Date of Patent: Jul. 27, 2010

(54) CLOCKING TECHNIQUE OF MULTI-MODULUS DIVIDER FOR GENERATING CONSTANT MINIMUM ON-TIME

(75) Inventor: Himanshu Arora, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/058,377

(22) Filed: Mar. 28, 2008

Related U.S. Application Data

(60) Provisional application No. 60/908,510, filed on Mar. 28, 2007.

(51) Int. Cl.
*H03L 7/06* (2006.01)

(52) U.S. Cl. ...................... 327/157; 327/114

(58) Field of Classification Search ......... 327/105–107, 327/113–119, 156–159; 377/47–48; 375/373–376; 331/1
See application file for complete search history.

(56) References Cited

U.S. PATENT DOCUMENTS

| | | | | |
|---|---|---|---|---|
| 6,147,530 | A * | 11/2000 | Nogawa | 327/156 |
| 6,985,551 | B1 | 1/2006 | Mattisson et al. | |
| 7,072,633 | B2 * | 7/2006 | Gomez et al. | 455/260 |
| 7,167,685 | B2 * | 1/2007 | Kakerow et al. | 455/76 |
| 7,320,081 | B2 * | 1/2008 | Akasaka et al. | 713/500 |

OTHER PUBLICATIONS

Arora et al., "Enhanced Phase Noise Modeling of Fractional-N Frequency Synthesizers," IEEE Transactions on Circuits and Systems—I: Regular Papers, vol. 52, No. 2, Feb. 2005, pp. 379-395.

Miller et al., "A Multiple Modulator Fractional Divider," IEEE Transactions on Instrumentation and Measurement, vol. 40, No. 3, Jun. 1991, pp. 578-583.

Riley et al., "Delta-Sigma Modulation in Fractional-N Frequency Synthesis," IEEE Journal of Solid-State Circuits, vol. 28, No. 5, May 1993, pp. 553-559.

Riley et al., "Techniques for In-Band Phase Noise Reduction in ΔΣ Synthesizers," IEEE Transactions on Circuits and Systems—II: Analog and Digital Signal Processing, vol. 50, No. 11, Nov. 2003, pp. 794-803.

Van de Beek et al., "A 2.5-10-GHz Clock Multiplier Unit With 0.22-ps RMS Jitter in Standard 0.18-μm CMOS," IEEE Journal of Solid-State Circuits, vol. 39, No. 11, Nov. 2004, pp. 1862-1872.

Vaucher et al., "A Family of Low-Power Truly Modular Programmable Dividers in Standard 0.35-μm CMOS Technology," IEEE Journal of Solid-State Circuits, vol. 35, No. 7, Jul. 2000, pp. 1039-1045.

International Standard ISO/IEC 8802-11, Information Technology—Telecommunications and information exchange between systems—Local and metropolitan area networks—Specific requirements—Part 11: Wireless LAN Medium Access Control (MAC) and Physical Layer (PHY) Specifications (1999).

* cited by examiner

*Primary Examiner*—Long Nguyen
*Assistant Examiner*—Sibin Chen

(57) ABSTRACT

An apparatus and method for converting an input frequency signal to an output frequency signal is able to detect and lock onto the phase and frequency of the input signal by using a fractional-N divider phase-locked loop configuration, in which a frequency division signal is generated having an on time that is independent of the division ratio of a fractional-N divider.

40 Claims, 18 Drawing Sheets

428

CLOCKING TECHNIQUE OF MULTI-MODULUS DIVIDER FOR GENERATING CONSTANT MINIMUM ON-TIME

CROSS-REFERENCE TO RELATED APPLICATION

The present application claims the benefit of U.S. Provisional Application No. 60/908,510, entitled "Clocking Technique of Multi-Modulus Divider for Generating Constant Minimum On-Time of Charge Pump for a Fractional-N Frequency Synthesizer Employing Separate Phase Detector and Frequency Detector," filed on Mar. 28, 2007, which is hereby incorporated by reference herein in its entirety.

FIELD OF TECHNOLOGY

The present disclosure relates generally to communication circuitry, and more particularly, to techniques for constructing a clock signal for accurately timing a signal.

DESCRIPTION OF THE RELATED ART

Clock creation and generation is an integral part of communication circuitry. Increasingly, transceivers are called upon to perform clock and data recovery on high speed signals, from which higher speed clock signals are generated. Such clock recovery is typically performed using phase-locked loops (PLLs), e.g., in a clock multiplier unit (CMU). Current designs, however, are limited in functionality and efficiency, limitations that have been detrimental to devices such as wireless local area network (WLAN) devices. In fractional-N (frac-N) frequency synthesizer PLL topologies, for example, CMUs using a combined phase frequency detector (PFD) have been designed. Delta-sigma frac-N frequency synthesizers offer the advantage of synthesizing small-frequency step sizes with reduced phase noise. The phase noise in frac-N synthesizers has been shown to suffer from non-linearity in charge pump (CP) operation. Some have suggested avoiding this non-linearity by operating one of the CPs for a constant time every reference clock cycle. Yet problems still abound. And as such, the inventor has found that it is desirable to generate a constant on-time for a frac-N synthesizer CP, and to do so by modifying timing in a separate multi-modulus divider circuit. To date, attempts have been limited to directly controlling CP timing or using integer-N synthesizers, all with less than desirable results.

SUMMARY OF THE DISCLOSURE

In one embodiment, a transmitter circuit for converting an input clock signal to an output clock signal, the transmitter circuit comprising: a signal processing circuit to produce the input clock signal and to produce parallel streams of data; a data multiplexing circuit to convert the parallel streams of data to serial data for transmission; and a clock multiplier circuit to convert the input clock signal to the output clock signal, the clock multiplier circuit comprising, a first circuit to detect a frequency and phase of the input clock signal and produce a voltage control signal, a voltage control oscillator to receive the voltage control signal and produce the output clock signal, and a multi-modulus frequency divider circuit to receive the output clock signal in a feedback configuration and produce a frequency division signal to drive the first circuit, where the frequency division signal has an on-time independent of a division ratio of the multi-modulus divider circuit.

In another embodiment, a clock multiplier circuit for converting an input clock signal to an output clock signal, the clock multiplier circuit comprising: a phase detector circuit to receive the input clock signal; a frequency detector circuit to receive the input clock signal, where the phase detector circuit and the frequency detector circuit are coupled to a frequency generator circuit to produce the output clock signal; and a multi-modulus divider circuit coupled to receive the output clock signal in a feedback manner and to produce a frequency division signal having an on-time independent of the division ratio, where the multi-modulus divider circuit is coupled to provide the frequency division signal to the phase detector circuit and the frequency detector circuit.

In yet another embodiment, a clock multiplier circuit for converting an input clock signal to an output clock signal, the clock multiplier circuit comprising: a first circuit dedicated to detect a phase of the input clock signal; a second circuit dedicated to detect a frequency of the input clock signal; a third circuit coupled to the first circuit and the second circuit to produce the output clock signal; and a multi-modulus divider circuit coupled to receive the output clock signal in a feedback manner and to produce a frequency division signal having an on-time independent of the division ratio, where the multi-modulus divider circuit is coupled to provide the frequency division signal to the phase detector circuit and the frequency detector circuit.

In still another embodiment, a method for converting an input frequency signal to an output frequency signal, the method comprising: detecting a phase of the input frequency signal; detecting a frequency of the input frequency signal; producing the output frequency signal; coupling the output frequency signal into a multi-modulus divider circuit receiving a division ratio signal; in the multi-modulus divider circuit, dividing the output frequency signal to produce a frequency division signal having an on-time that is independent of the division ratio signal; and providing the frequency division signal in a feedback manner to control the detecting of the phase of the input frequency signal and to control the detecting of the frequency of the input frequency signal.

DETAILED DESCRIPTION

Figure 1:
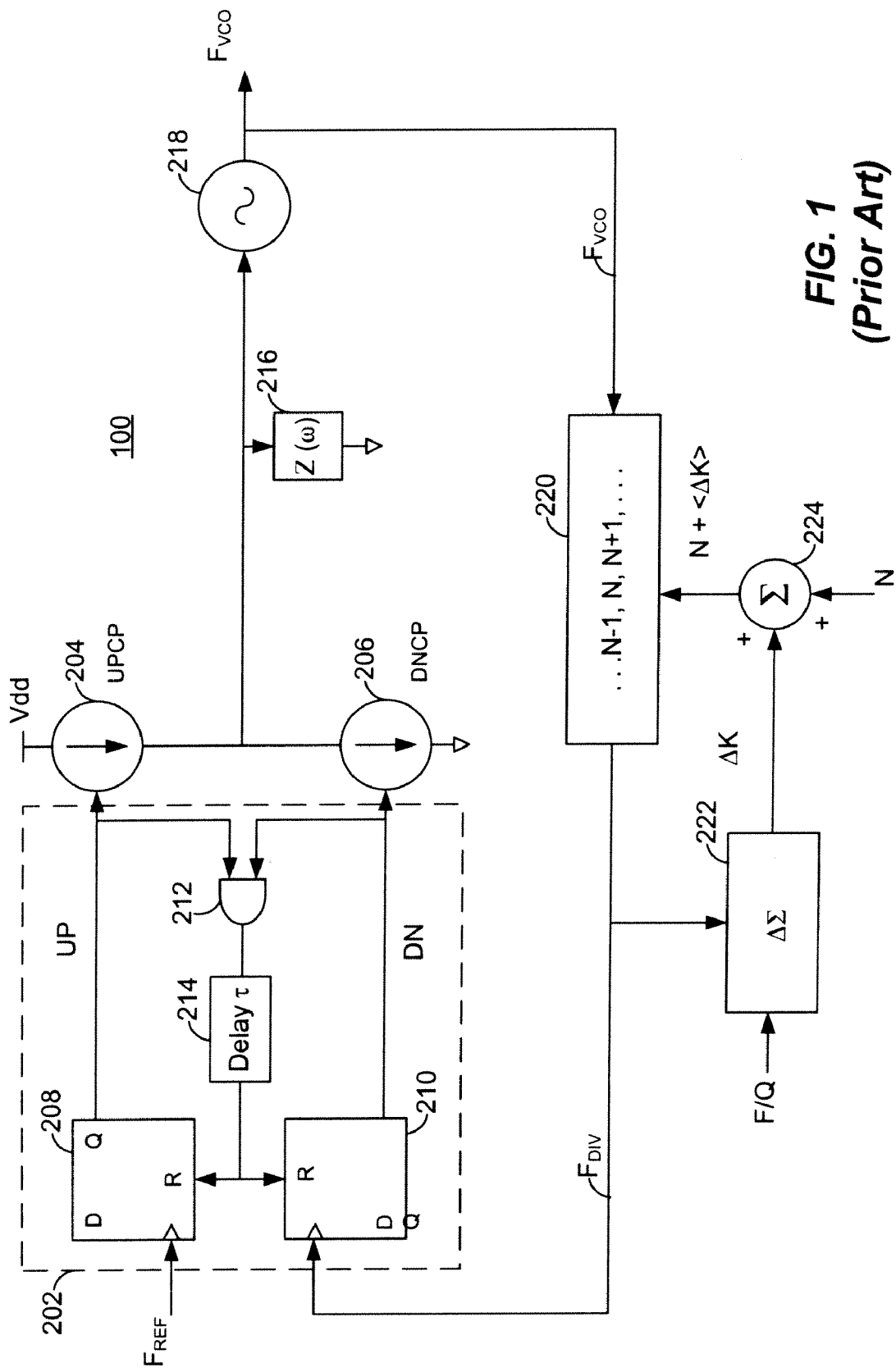
FIG. 1 is a block diagram of a conventional fractional-N phase locked loop.

Conventional clock multiplier units (CMUs) work in conjunction with digital signal processors to convert an input clock signal, such as a 622 MHz or 2.5 GHz to an output clock signal, such as a 10 GHz clock signal used in many Gigabit WLAN applications. FIG. 1 illustrates a conventional phase locked loop configuration 100 using a 3-state combined Phase/Frequency Detector (PFD) 202 to control locking onto an input reference frequency signal, $F_{REF}$. The PFD 202 is formed by two flip flops 208, 210 that provide an UP signal and a down (DN) signal, respectively, to an UP charge pump (UPCP) 204 up and a down charge pump (DNCP) 206. Signal $F_{REF}$ latches flip flop 208, while a frequency division signal, $F_{DIV}$, latches the flip flop 210.

The PFD 202 includes a reset path formed by an AND gate 212 coupled to the UP and DN outputs and by a delay generation circuit (τ) 214. The τ delay avoids the dead-zones in the PFD 202, and CPs 204 and 206. The CPs 204 and 206 charge a loop filter circuit 216, labeled Z(ω), that is an RC circuit for reducing noise on the output of a frequency generator circuit, such as the voltage controlled oscillator (VCO) 218 generating a signal $F_{VCO}$.

The signal $F_{VCO}$ is coupled to a fractional-N (frac-N) divider frequency synthesizer circuit 220 in a feedback configuration. A delta-sigma Δτ modulator (ΔΣ) 222 accepts an input signal and produces a fractional output signal ($\Delta_K$) that is summed with an integer input signal (N) by a summer circuit 224. The summer circuit 224 sets the instantaneous division ratio $N_K$ of the divider circuit 220, the time average of which will be N+F/Q.

As a consequence, the frac-N divider circuit 220 produces the frequency division signal, $F_{DIV}$, resulting in an instantaneous phase error to appear at the input of the PFD 202. The CPs 204 and 206 can convert this phase error to current pulses to charge the loop filter 216 and ensure that the frac-N divider 220 remains locked with the output signal $F_{VCO}$. The signal $F_{DIV}$ is also used to clock the ΔΣ modulator 222 to control frequency synthesis.

Figure 2:
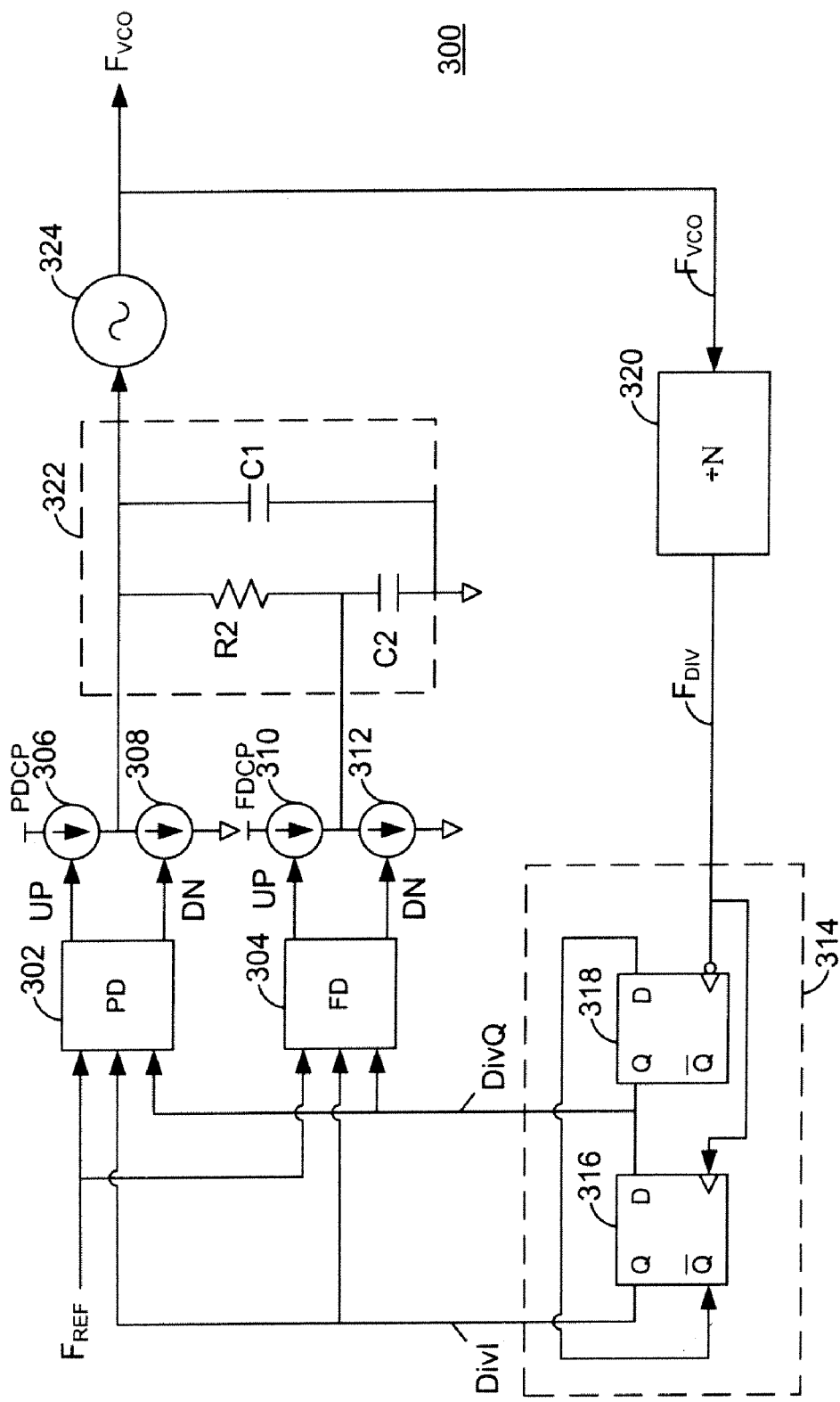
FIG. 2 is a block diagram of a conventional phase locked loop using a phase detector, frequency detector, and an integer-N frequency synthesizer.

FIG. 2 illustrates another conventional clock multiplier unit circuit 300 in an Integer-N PLL topology. In place of the PFD 202 in circuit 100, the circuit 300 uses a separate phase detector (PD) circuit 302 and frequency detector (FD) circuit 304. The detectors 302 and 304 receive the reference frequency signal $F_{REF}$, an in-phase division frequency signal, DivI, and a quadrature-phase frequency signal, DivQ, 90° out of phase with the DivI. The detectors 302 and 304 each provide respective UP and DN output signals to corresponding charge pumps 306/308 and 310/312, respectively. A divide-by-2 circuit 314 formed by flip flops 316 and 318 generates the DivI and DivQ signals, such that the quadrature phase offset between DivI and DivQ generates the minimum on-time of the CPs.

A key limitation of the configuration of FIG. 2 is that the input to the divide-by-2 circuit 314 (i.e., the output of a divide-by-N circuit 320) must have a 50% duty-cycle signal for the DivI and DivQ signals to be in quadrature phase. In the case of the circuit 300, this means the divide-by-N circuit 320 must be configured as a divide-by-2 circuit.

The CPs 306-312 supply current signals (a phase detection circuit current signal and a frequency detection circuit current signal) to loop filter 322 formed of a resistor R2 and capacitor C2 both in parallel with capacitor C1. The loop filter 322 converts the input current signal to a voltage signal to control VCO 324 for producing signal $F_{VCO}$.

In the examples of FIGS. 1 and 2, it would be beneficial if the $F_{DIV}$ signal had a constant on-time of τ, to minimize the on-time for the CP's 204 and 206 in place of time delay 214. Yet, in both examples, the $F_{DIV}$ signal does not have a constant on-time, but rather an on-time that varies with the instantaneous division ratio of the frequency synthesizer, circuit 222. This variable on-time prevents the frac-N PLL from locking.

Figure 3A:
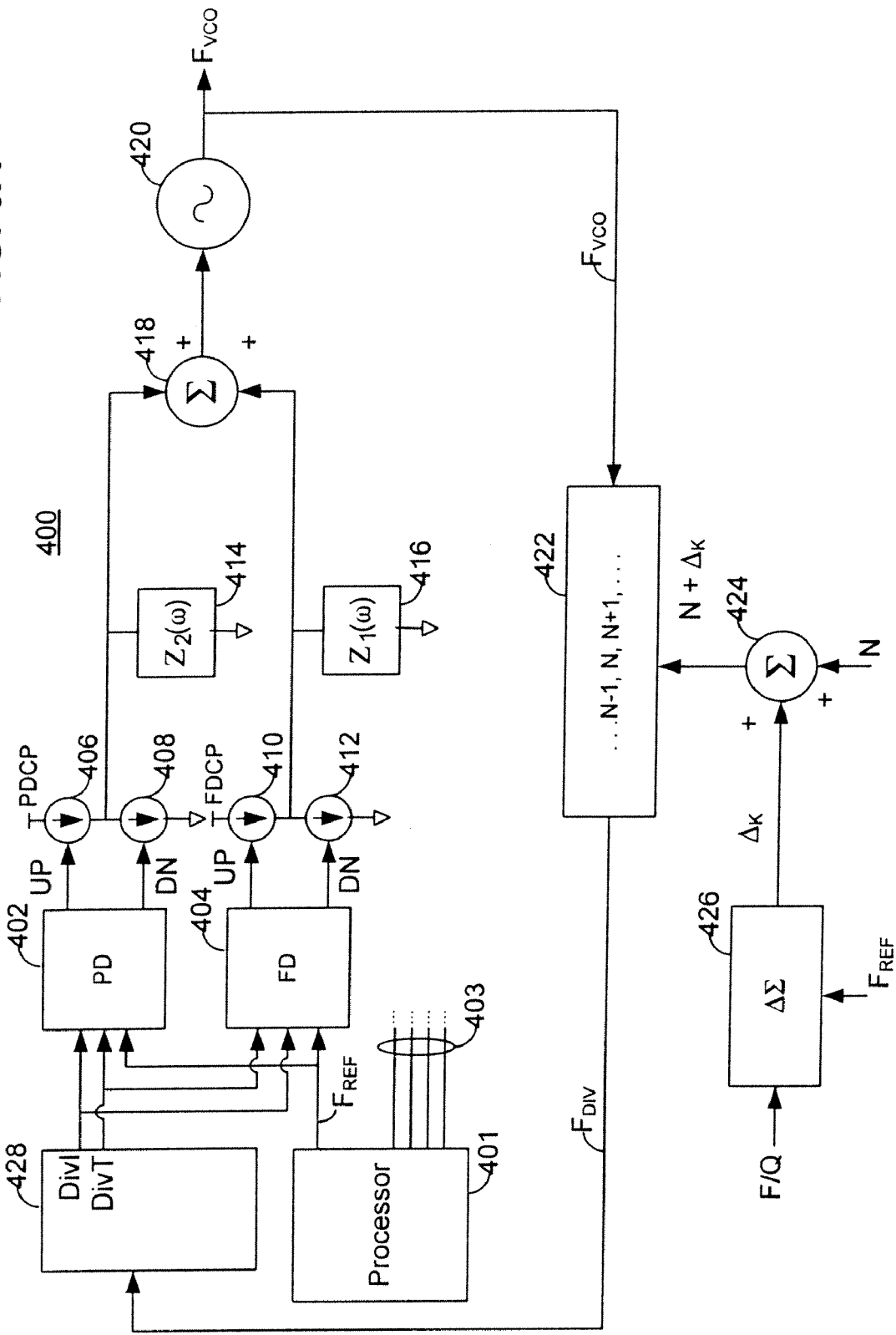
FIG. 3A is a block diagram of a phase locked loop in accordance with a present example and using an fractional-N frequency synthesizer.

FIG. 3A shows PLL circuit 400 in accordance with the present application and formed of a multi-modulus frequency synthesizer capable of generating a $F_{DIV}$ signal that has an on-time which is constant and independent of an instantaneous division ratio. The circuit 400 generates the $F_{DIV}$ signal for a PLL configuration having separate phase and frequency detectors and generates a signal with a minimum on-time for the charge pumps, and thus may have an on-time, τ, of the PLL circuit 400. The circuit 400 includes a signal processor 401 that generates the input frequency, or clock, signal $F_{REF}$ and parallel streams of data collectively shown as 403. The circuit 400 includes a separate PD 402 and FD 404 receiving signal $F_{REF}$. The PD 402 generates UP and DN output signals to CPs 406 and 408, respectively, while the FD 404 generators UP and DN output signals to CPs 410 and 412, respectively.

The FD 404 is designed to lock the feedback divider signal, $F_{DIV}$, to a frequency signal, $F_{REF}$. Once the frequency lock is achieved the frequency detector 404 is turned off, that is, both UP and DN signals from the FD 404 are 0. That is, the FD 404 is operational only when there is a difference between $F_{DIV}$ and $F_{REF}$. Frequency locking leads to the frequency detector charge pumps 410/412 being turned off in a tri-state mode. The gain of the frequency loop is independent of the $F_{REF}$ clock frequency. Simulations show that for a constant frequency difference between $F_{DIV}$ and $F_{REF}$, the amount of charge dumped by the frequency detector charge pumps 410/412 to the loop filter 416 in a given time is independent of the frequency of $F_{REF}$. This means that the gain of the FD 404 is independent of the magnitude of $F_{REF}$.

The PD 402 is operational such that if the phase difference between DivI and DivT is fixed, then the DN signal from the PD 402 will have a constant pulse width, equal to that phase difference. During locking, the UP signal will vary in pulse width. In general, the UP and DN output signals from the FD 404 can both be high at the same time; however, the UP and DN output signals from the PD 402 would not. For a further discussion of an example implementation of the circuits 402 and 404, the reader is directed to U.S. application Ser. No. 12/044,532, entitled "Fractional-N Frequency Synthesizer with Separate Phase and Frequency Detectors," filed on Mar. 7, 2008, which is hereby incorporated by reference herein.

In any event, for both the PD 402 and the FD 404, timing diagrams showing example operation of the circuits based on DivI and DivT are discussed below in reference to FIGS. 11 and 12.

The CP pair 406/408 act as a phase detection charge pump circuit that provides a phase detection current signal to a first loop filter circuit 414. The CP pair 410/412 act as a frequency detection charge pump circuit that provides a frequency detection current signal to a second loop filter circuit 416. The charge pump pairs either source charge to the respective filter elements or sink charge therefrom. Both loop filters 414 and 416 may be formed of an RC element converting an input charge current to a voltage control signal. In other examples, the charge pumps and current-to-voltage converters may be replaced with other voltage generation circuits for controlling a frequency generation circuit. The voltage outputs from each filter 414, 416 are coupled to a summing circuit 418 producing a summation voltage to control VCO 420.

A frac-N frequency synthesizer circuit 422 generates the $F_{DIV}$ feedback signal from input signal, $F_{VCO}$, and a fractional division ratio from summer circuit 424. The circuit 424 receives an integer divisional signal, N, and fractional output signal $\Delta_K$ from a $\Delta\Sigma$ modulator 426, where F and Q are integers. The $\Delta\Sigma$ modulator 426 receives the $F_{REF}$ signal as an input frequency or clock signal in the illustrated example, although in other examples, the $\Delta\Sigma$ modulator 426 could be in a feedback configuration receiving signal $F_{DIV}$ from the synthesizer 422 or another clock signal.

The $F_{DIV}$ signal is coupled to an additional DivI-DivT circuit 428 (see, e.g., FIG. 10A) that produces DivI and DivT signals to control the operation of the PD 402 and the FD 404.

The circuit 400 reduces noise on the output frequency, $F_{VCO}$, in comparison to the conventional circuits of FIGS. 1 and 2, in part by linearizing the operation of the charge pumps, which improves the phase noise on $F_{VCO}$. In the frac-N PLL 100, the UP and DN CPs 204 and 206 must both be on for a time-varying time to achieve locking. In the circuit 400, only one charge pump need be on for a time-varying time every reference clock cycle. The other charge pump is on for a constant time every reference clock cycle, thereby linearizing charge pump operation.

Figure 3B:
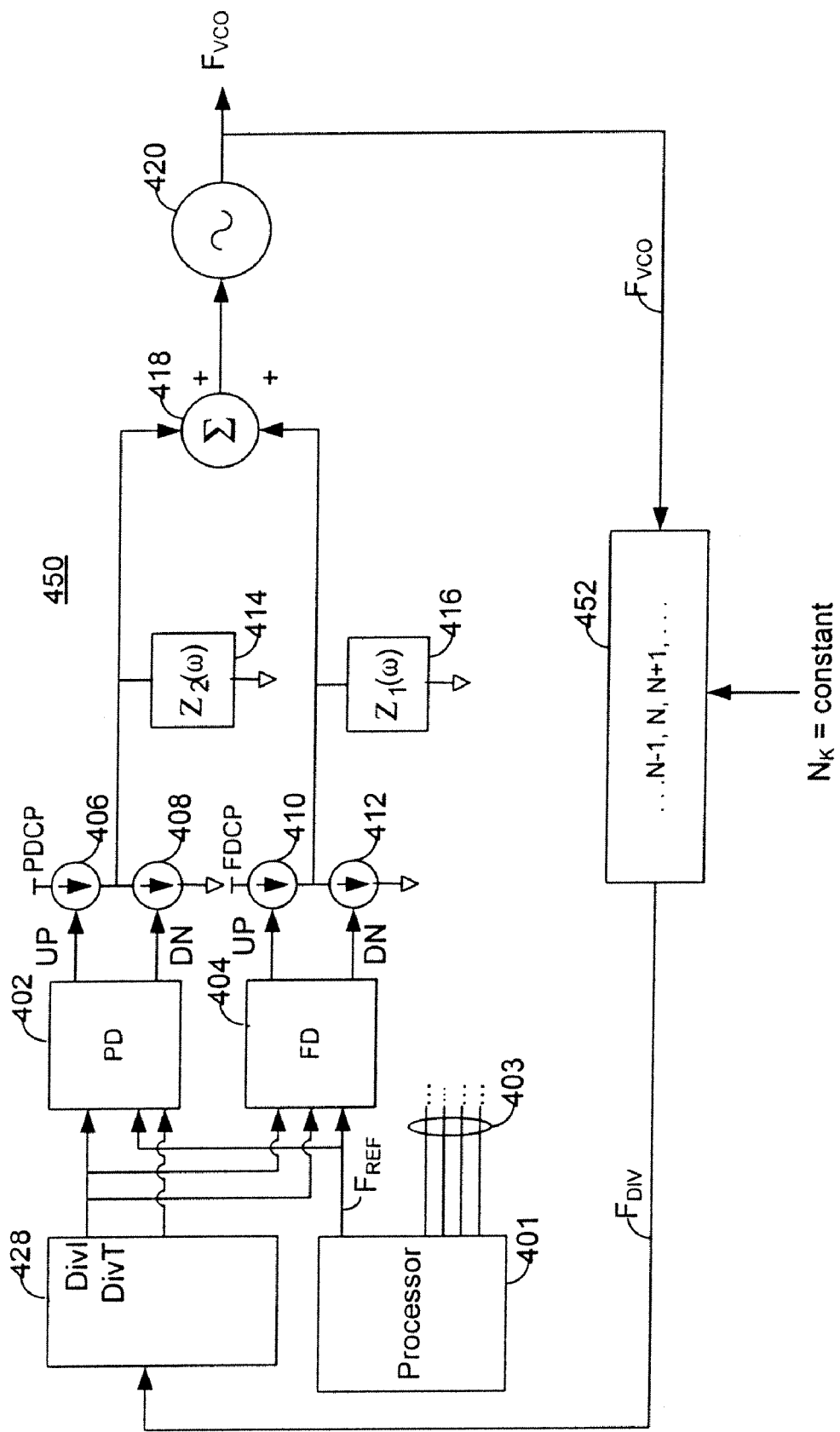
FIG. 3B is a block diagram of a phase locked loop in accordance with another example and using an integer-N frequency synthesizer.

FIG. 3B illustrates another clock multiplier circuit 450 similar to that of FIG. 3A, except the circuit 450 is in an integer-N PLL configuration, having a integer-N frequency synthesizer 452 in place of the synthesizer 422, $\Delta\Sigma$ modulator 426, and summer circuit 424. The synthesizer 452 can represent a dedicated integer-N frequency divider, or it can represent a frac-N frequency divider during a mode when the input instantaneous division ratio is an integer $N_K$, which is a constant in this example.

Figure 4:
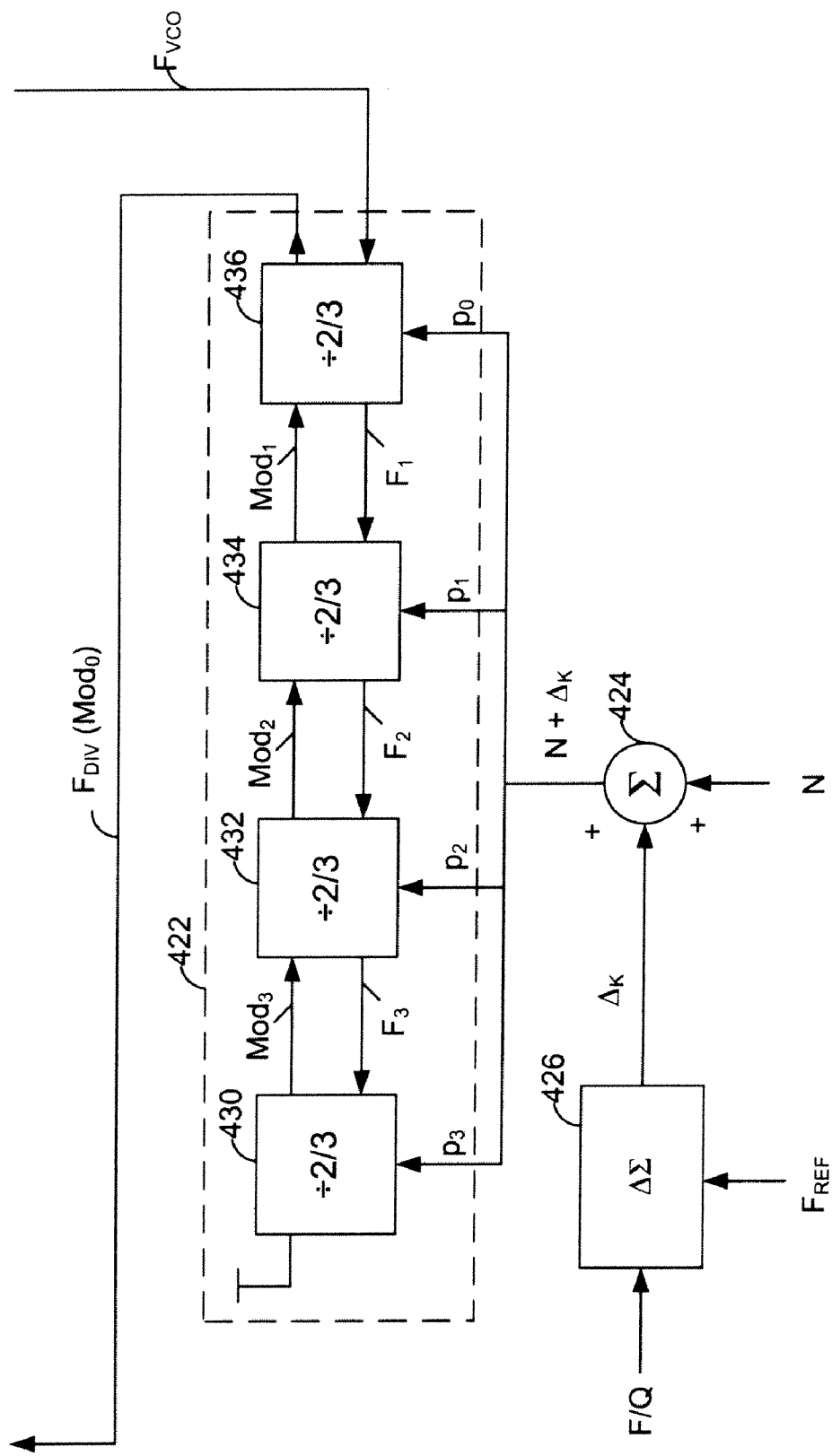
FIG. 4 is a block diagram of the fractional-N frequency divider circuit of FIG. 3A formed of a plurality of ÷⅔ cell stages.

FIG. 4 illustrates an expanded illustration of the frac-N divider circuit 422 and showing the multi-modulus divider chain. The circuit 422 includes a chain of dual-modulus divider cell stages 430, 432, 434, and 436, each with an instantaneous division ratio controlled by the $\Delta\Sigma$ modulator 426 and the summer circuit 424. In the illustrated example, each stage 430-436 is a $\div 2/3$ cell stage capable of dividing an input signal by either 2 or 3 depending on if a control signal ($p_K$) is high or low. Each stage has two input signals $F_{IN}$ and $Mod_{IN}$ and generates two divided output signals, a frequency output signal, $F_{OUT}$, and a $Mod_{OUT}$. In the illustrated configuration, the output signals of one stage act as the input signals to another stage. Thus, the stage 436 receives input signals $F_{VCO}$ and $Mod_1$ from stage 434 and produces output frequency signal $Mod_0$, which is $F_{DIV}$ in the illustrated example of FIG. 4, and $F_1$, which acts as an input to stage 434. Stage 434 also receives input signal $Mod_2$ from stage 432 and produces an output frequency signal $F_2$, which acts as an input to stage 432. Stage 432 also receives input signal $Mod_3$ and produces an output frequency $F_3$, which acts as an input to stage 430. Stage 430 also receives a reference high voltage as an input signal. In addition to the signals as described, each of the stages 430-436 receives an input fractional division ratio signal labelled $p_0$-$p_3$ ($p_{N-1}$) to control the instantaneous division.

In the illustrated example, the $\Delta\Sigma$ modulator 426 receives signal $F_{REF}$ as a clock signal, although as stated above in other examples the signal $F_{DIV}$ may be fed back as the clock signal instead. In operation, for a F/Q ratio of 0.4325 (the time average of bits provided to the DSM 426), if an integer N=11 has been coupled to the summer 424, then the input fractional division ratio signals to the stages 430-436 will be 11.4325, i.e., a fractional division number that is the arithmetic sum of the $\Delta\Sigma$ modulator 426 output and the integer input to the summer circuit 424.

As shown in FIG. 4, $Mod_N$ signals propagate up the divider chain and are re-timed by the input clock signal to each $\div 2/3$ divider cell stage 430-436. In a preferred example, the output $Mod_N$ signal of each divider stage 430-436 is a non-50% duty cycle signal ($Mod_0$, $Mod_1$ ... $Mod_{N-1}$). For lower noise on the divider feedback clock, $Mod_N$ is used where typically with N as a small integer. Four divider stages are shown, but it is understood that any number of fewer or more divider stages may be used instead depending on the $F_{REF}$ and $F_{VCO}$ to be synthesized.

The pulse width of the divider chain $Mod_N$ signals progressively decreases as the $Mod_N$ reaches closer to the divider circuit 428, explained further in regards to FIGS. 6-9. In other words, pulse width (on-time) of $Mod_{N-1} > Mod_{N-2} > ... > Mod_2 > Mod_1 > Mod_0$.

It is possible in some configurations that the pulse width of these $Mod_N$ signals will be dependent on the divider value (fractional division ratio) being synthesized (the output code of DSM $p_{N-1}$ $p_2$ $p_1$ $p_0$). Yet, this is not desirable as it will prevent the designer from using this signal for generating a "constant" minimum on-time for the CP used in PLL, which is why the circuit 400 is designed to produce a constant on time for the $Mod_N$ signals.

In order to generate a fixed minimum on-time (t) for the CPs 406-412 from the multi-modulus divider chain of circuit 422, the divider output signal ($F_{DIV}$) on-time must be constant irrespective of the instantaneous divider value being synthesized by the $\Delta\Sigma$ modulator 426. This on time is independent of the order, topology and clock frequency of the $\Delta\Sigma$ modulator 426. This constant pulse width signal is then used to generate the DivI and DivT signals, as discussed further below.

FIGS. 3A and 4 also reflect the test-bench used to simulate dependence of the $Mod_N$ pulse width on the division ratio. In the multi-modulus divider chain of circuit 422, the $Mod_0$ signal is used for $F_{DIV}$, the feedback divider clock to the divider circuit 428. In a test example, the frequency $F_{VCO}$ was 5 GHz, though any arbitrary VCO frequency could have be chosen for the design. The pulse width of the $Mod_3$ and $Mod_2$ signals were observed under different division ratios. Any arbitrary number of $\div 2/3$ cells could have been taken in the divider chain for verification purpose. In the example of FIG. 3A, a cascade of four $\div 2/3$ cells was chosen for stages, which divider chain can divide by any integer number from 16 to 31, where this division ratio is controlled by the bits $p_3 p_2 p_1 p_0$, from the summer circuit 424. For testing purposes, a maximum division ratio of 31 and a minimum division ratio of 16 were chosen.

Figure 5A:
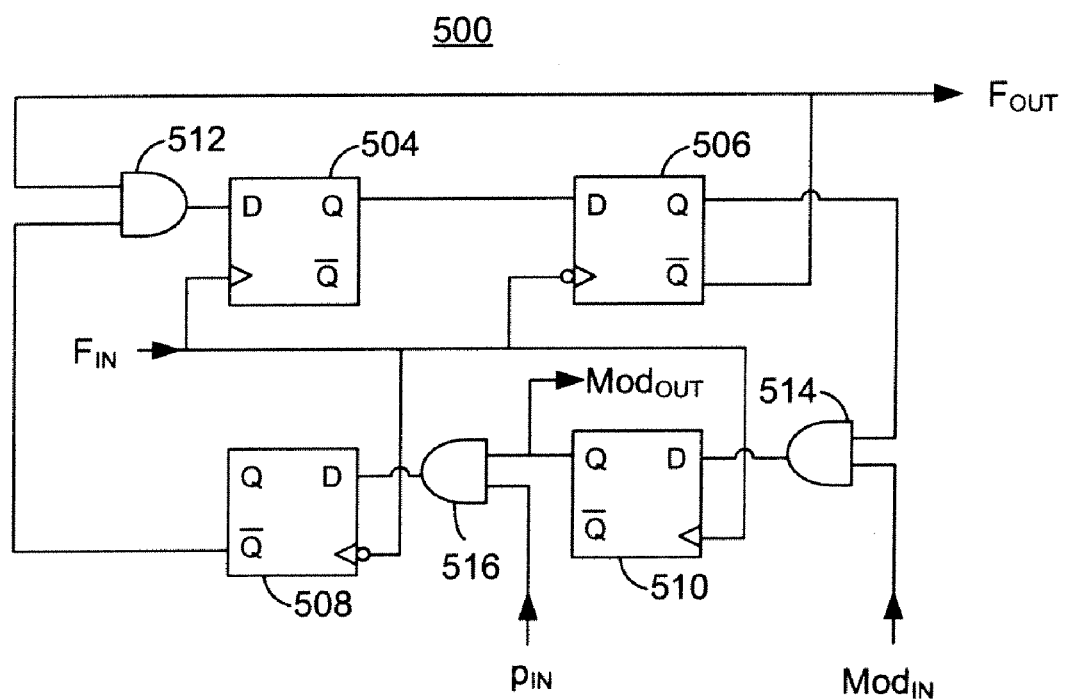
FIG. 5A is a block diagram of a conventional circuit topology for a ÷⅔ cell stage.
Figure 5B:
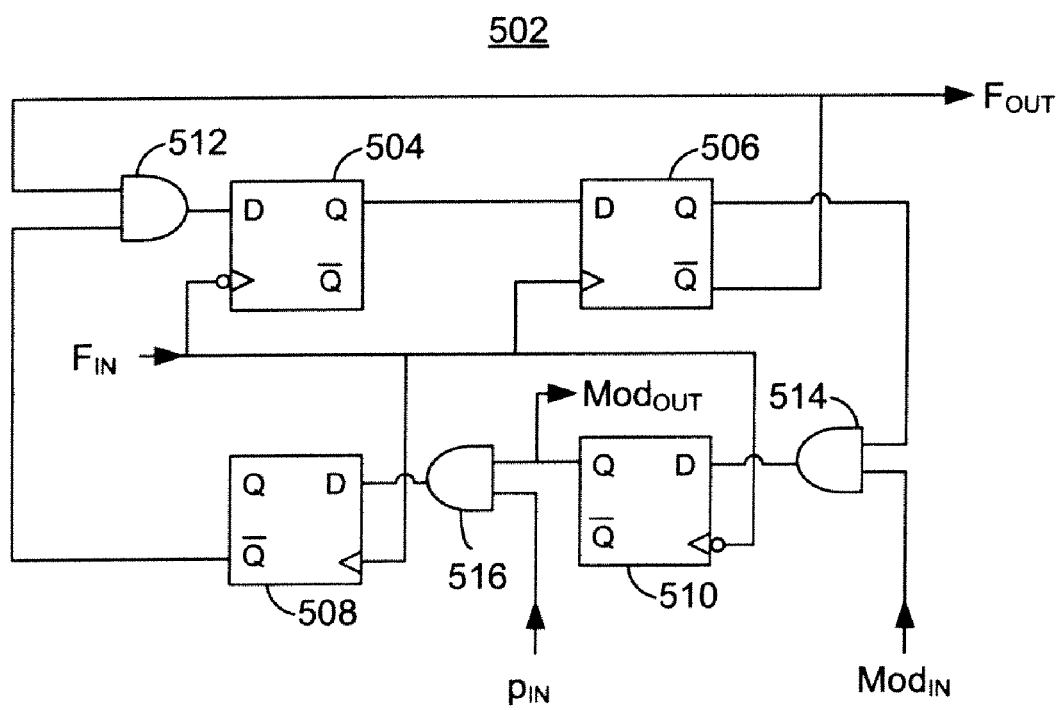
FIG. 5B is a block diagram of a circuit topology for a ÷⅔ cell stage in accordance with the present application.

To test operation of the circuit 400, the ÷⅔ cell stages 430-436 were chosen from between two topologies shown in FIGS. 5A and 5B. FIG. 5(a) shows a prior art circuit topology 500 for a ÷⅔ cell stage that would form each stage of the frac-N divider 422. In contrast to FIG. 5(a), FIG. 5(b) shows a circuit topology 502 in accordance with the present application and which generates $Mod_N$ signals of constant on-time. Each of these circuits 500 and 502 comprise four D Latches 504-510 and 3 AND gates 512-516, as shown. The circuit 502 has the clock polarity on the latch lines inverted from that of circuit 500.

The frac-N divider circuit 422 was implemented with ÷⅔ cell stages from each of circuit 500 and 502 and with different fractional divisions in accordance with the following conditions. $F_{VCO}$, was set to 5 GHz. In a first test, $p_3p_2p_1p_0$ was set to 0000, representing Ndiv=16. In a second test, $p_3p_2p_1p_0$ was set to 1111, representing Ndiv=31.

Figure 6:
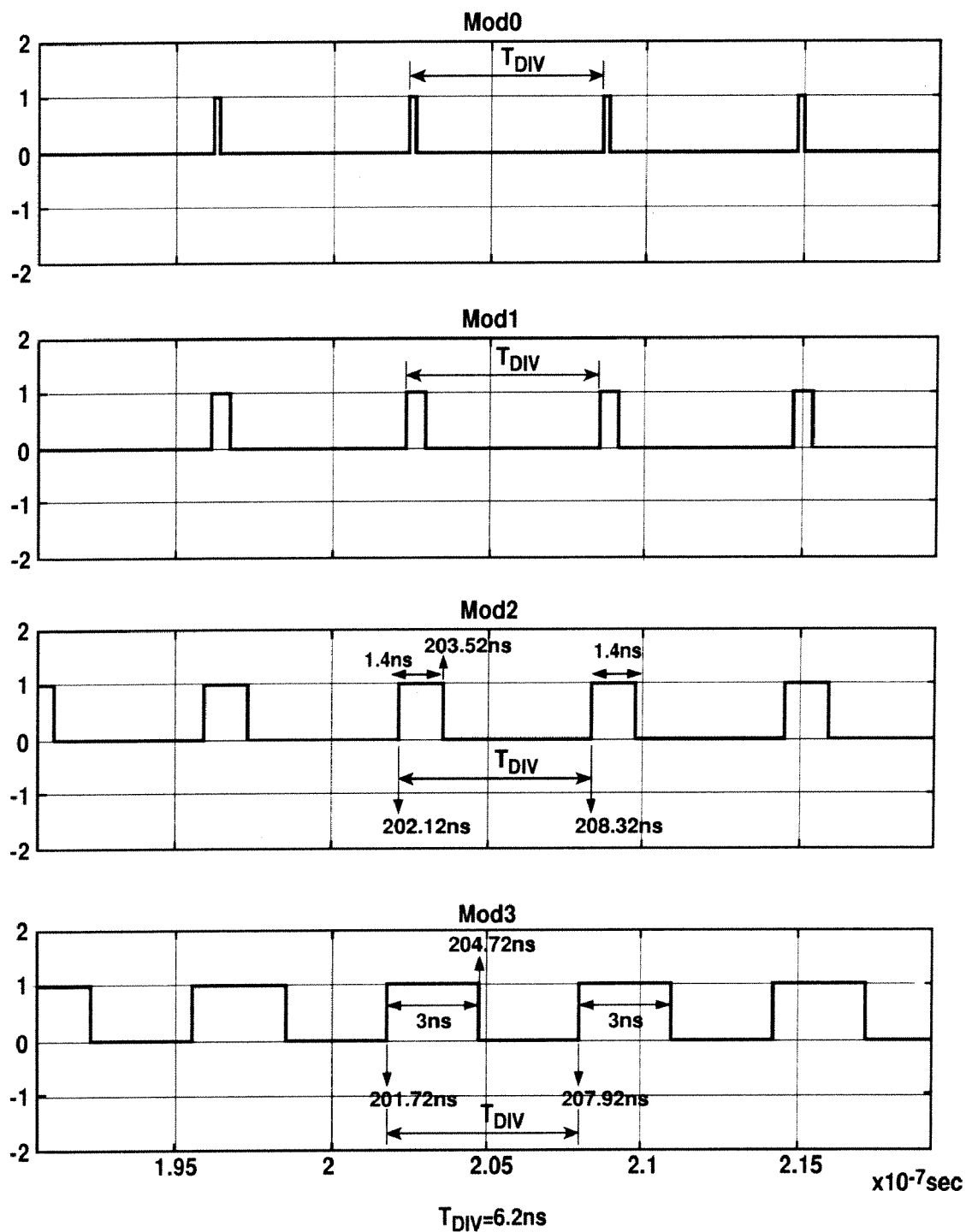
FIG. 6 is a plot of the mod output signals from each cell stage of the fractional-N divider for the circuit of FIG. 3A using a ÷⅔ cell stage in accordance with FIG. 5A and having a division ratio of 31.
Figure 7:
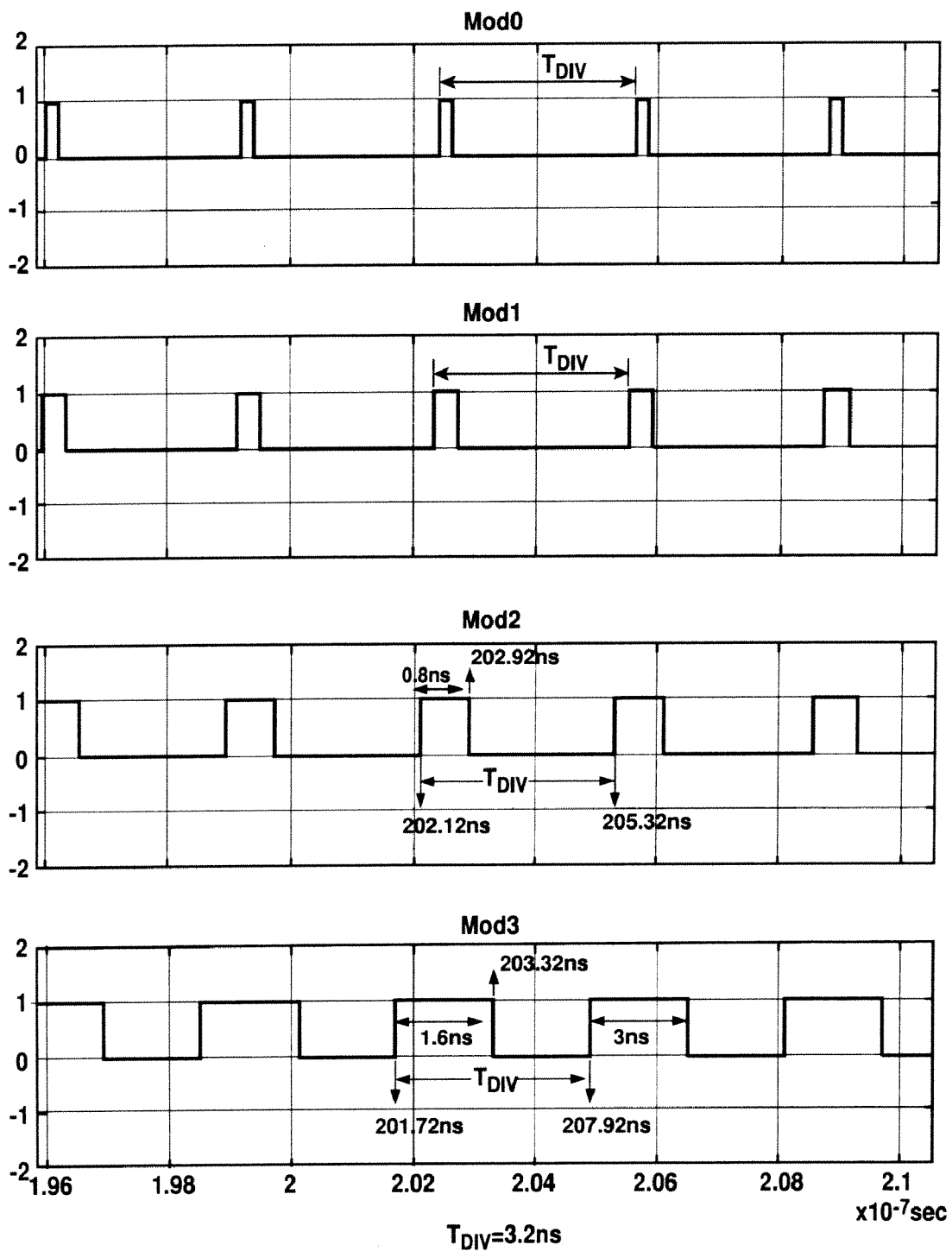
FIG. 7 is a plot of the mod output signals from each cell stage of the fractional-N divider for the circuit of FIG. 3A using a ÷⅔ cell stage in accordance with FIG. 5A and having a division ratio of 16.

FIGS. 6 and 7 present the simulation of a test bench as shown in FIGS. 3A and 4 and using the ÷⅔ cell stage of circuit 500 and under maximum (FIG. 7) and minimum (FIG. 8) division ratios, respectively. Signals $Mod_0$-$Mod_3$ are all plotted; although for the test bench, only the $Mod_2$ and $Mod_3$ signal pulse widths were specifically measured. In FIG. 6, the rising edges of $Mod_3$ are 6.2 ns apart. This corresponds to division by 31. The same holds true for the rising edges of other Mod signals in FIG. 6. From FIGS. 6 and 7 it is apparent that the on-time of $Mod_2$ and $Mod_3$ signals (as well as that for all the Mod signals) is dependent on the division ratio. For example, in the case of division by 31 (FIG. 6) the on-time of $Mod_3$ was measured to be 3 ns, while the on-time for $Mod_3$ was 1.6 ns (FIG. 7) in the case of division by 16. The plots thus show that the circuit 500 as the ÷⅔ cell stage is not suitable for generating a constant pulse width $Mod_N$ signal to be used for CP in a frac-N PLL topology. The $Mod_N$ signal (ultimately the $F_{DIV}$ signal) produced by each cell has an on-time that depends on the division ratio set by the ΔΣ modulator 426, and therefore is not constant.

Figure 8:
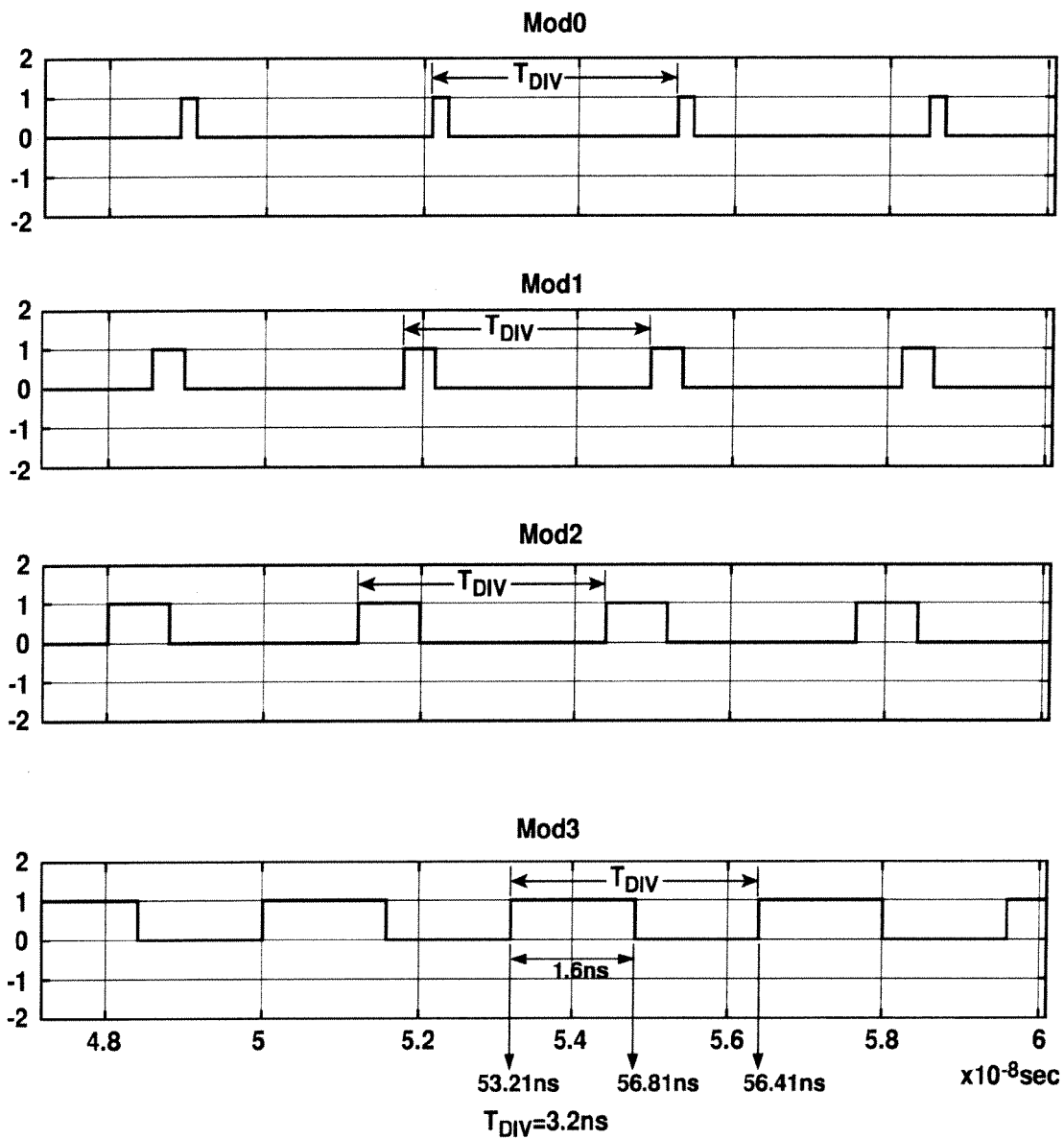
FIG. 8 is a plot of the mod output signals from each cell stage of the fractional-N divider for the circuit of FIG. 3A using a ÷⅔ cell stage in accordance with FIG. 5B and having a division ratio of 16.
Figure 9:
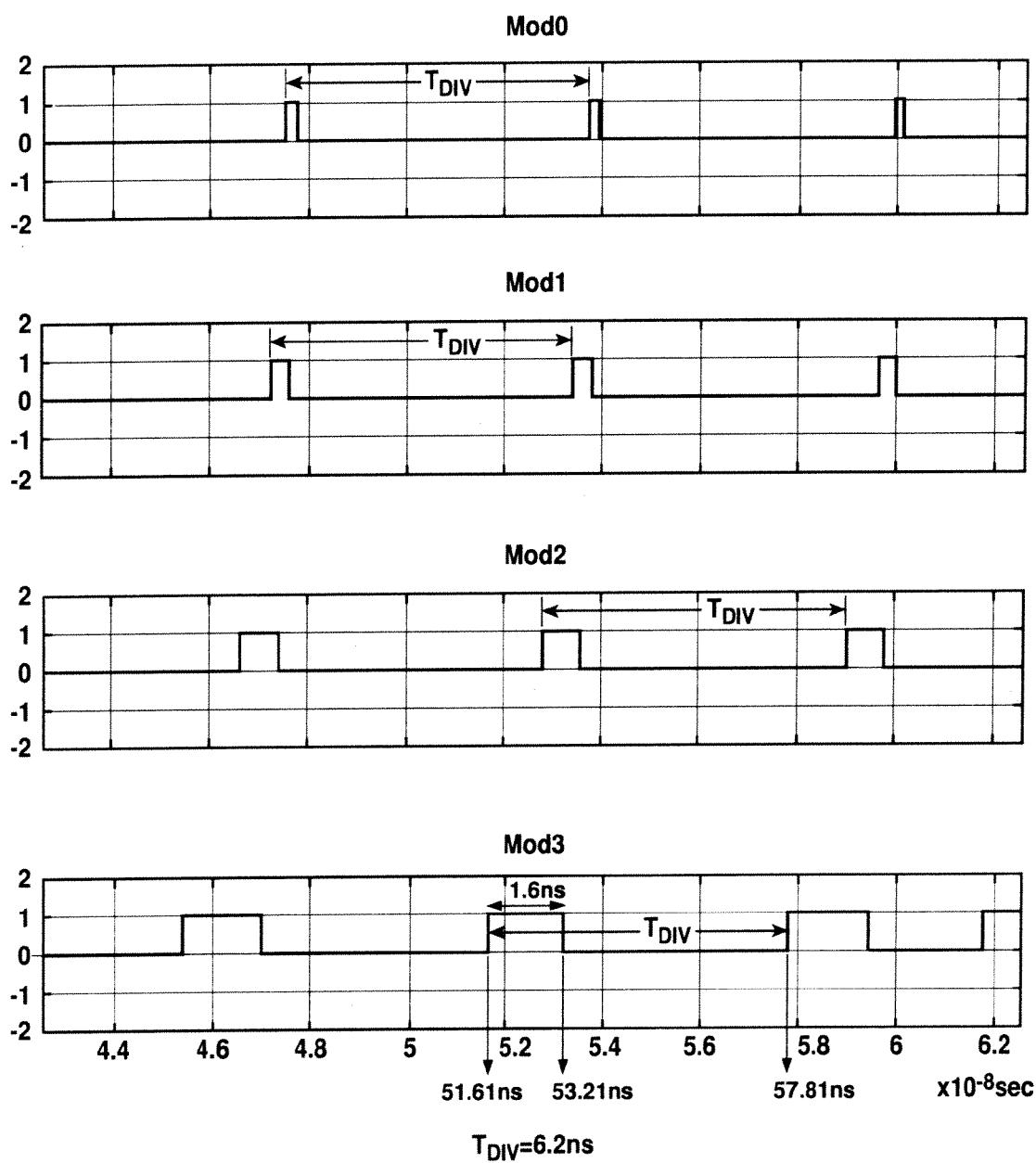
FIG. 9 is a plot of the mod output signals from each cell stage of the fractional-N divider for the circuit of FIG. 3A using a ÷⅔ cell stage in accordance with FIG. 5B and having a division ratio of 31.

In contrast to FIGS. 6 and 7, the test bench data plotted in FIGS. 8 and 9 shows that using the circuit 502 in the cells of a fractional-N divider results in constant on time output $F_{DIV}$ signal, that is one in which the on time is independent of the division ratio. FIG. 8 illustrates the simulation of the test bench as shown in FIGS. 4 and 5 and using the ÷⅔ cell stage of circuit 502 and under maximum (FIG. 8) and minimum (FIG. 7) division ratios, respectively. The $Mod_3$ signal pulse width was observed. In both plots, the $Mod_3$ pulse width was 1.6 ns. Thus, the $Mod_N$ signal pulse width is independent of the division ratio for the divider implementation of circuit 502 in FIG. 5(b), meaning that by using the circuit 502 as the divider cell, a $Mod_N$ signal of constant pulse width can be obtained irrespective of the division ratio.

The constancy of the on time occurs for each stage of the fractional-N divider 422, using the circuit 502. This was apparent from comparing the on times of the signals from each of the stages, $Mod_0$, $Mod_1$, $Mod_2$, and $Mod_3$.

From FIGS. 6-9, it is apparent that not only does the circuit 502 offer a constant on time $F_{DIV}$ signal in comparison to the circuit 500, the circuit 500 in contrast produces a constant duty cycle, independent of the division ratio. For the circuit 400, the duty cycle for each of the signals $Mod_0$, $Mod_1$, $Mod_2$, and $Mod_3$ is the same for a minimum division 16 (FIG. 7) and a maximum division 31 (FIG. 6). In contrast, the circuit 502, while producing a constant on time, does not produce a duty cycle that is independent of the division ratio.

Thus, it can be observed from the simulation results of FIGS. 6-9 that the ÷⅔ cell stage of FIG. 5(a) results in an approximately constant duty-cycle Mod signal where as the ÷⅔ cell of FIG. 5(b) results in constant on-time of the Mod signal.

Figure 10A:
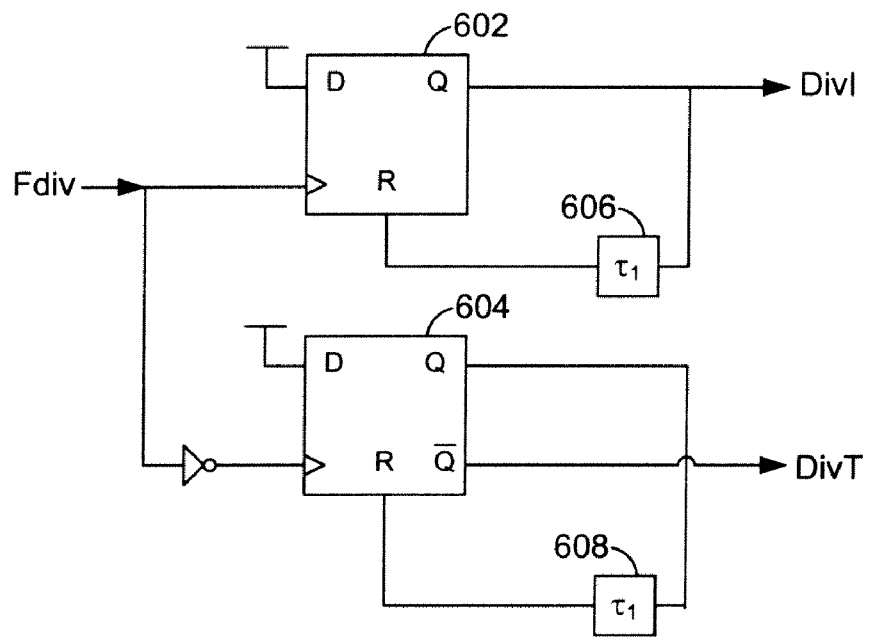
FIG. 10A is a block diagram of an example implementation of a divider circuit 428 of FIG. 4.
Figure 10B:
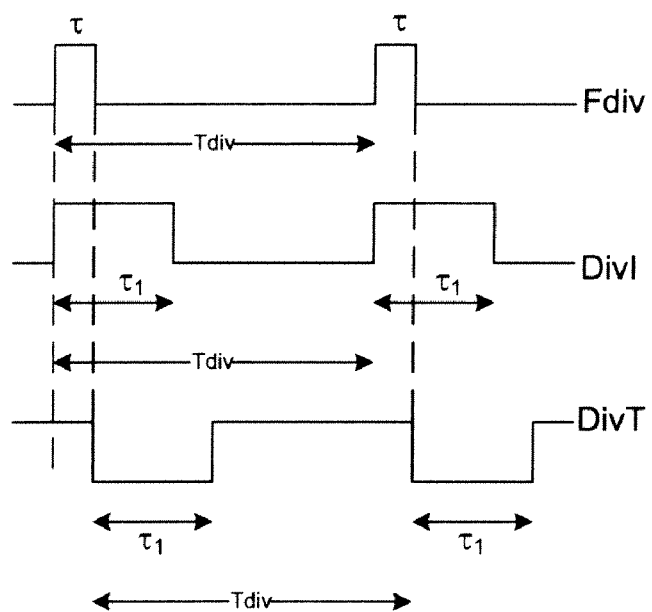
FIG. 10B is a timing diagram of signals corresponding to FIG. 10A.

FIG. 10A shows an example implementation of DivI DivT circuit 428 and showing how the constant on time $F_{DIV}$ signal is used to create constant minimum on time signals for the CPs 406-412. The DivI DivT circuit 428 is used to generate a constant minimum on-time of these CP 406-412. The circuit comprises of two D Flip flops 602, 604 and time delays, Σ1, 606 and 608 are used as shown to generate signals DivI and DivT. The time between rising transitions on $F_{DIV}$ is shown in FIG. 10B and is $T_{DIV}$, the same rising transition differences between adjacent pulses on the signal DivI and DivT. Signal DivT is "τ" timeout of phase with signal DivI, but as shown need not be 90° out of phase like as between DivI and DivQ of conventional circuits. The pulse width for $F_{DIV}$ is τ and is constant and independent of the division ratio of the topology and order of DSM. The pulse widths for the signals DivI and DivT are T1 as shown.

Figure 11:
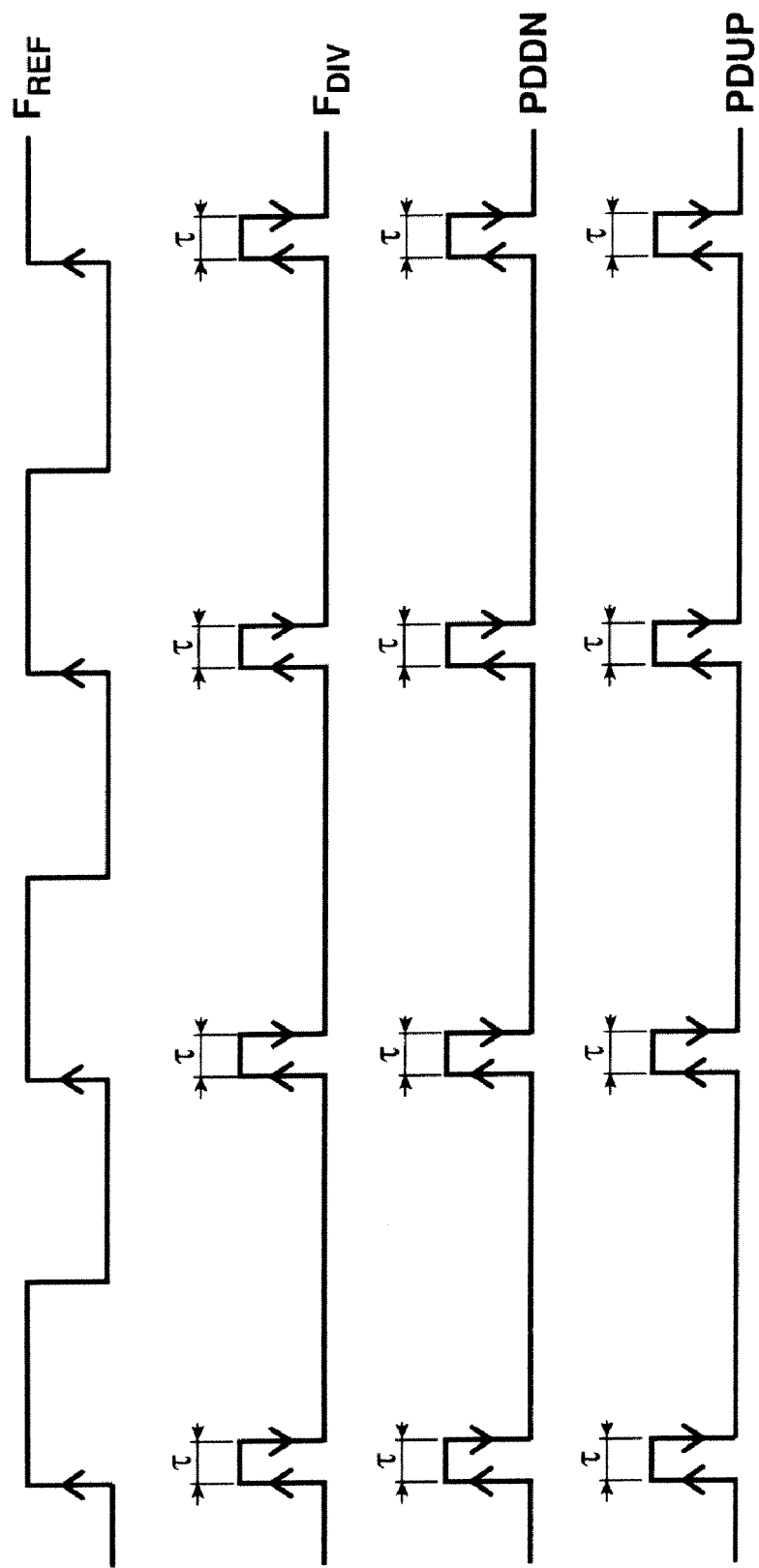
FIG. 11 is a timing diagram for the integer-N phase locked loop of FIG. 3B using the ÷⅔ cell stage of FIG. 5B.

FIG. 11 shows the timing diagram of integer-N PLL in lock (FIG. 3B) using ⅔ cell stage 502 of FIG. 5B. Both PDDN and PDUP are on for time τ given by the on-time of the frequency division signal $F_{DIV}$. Signals PDDN and PDUP have a constant on-time, as $F_{DIV}$ has a constant on time.

Figure 12:
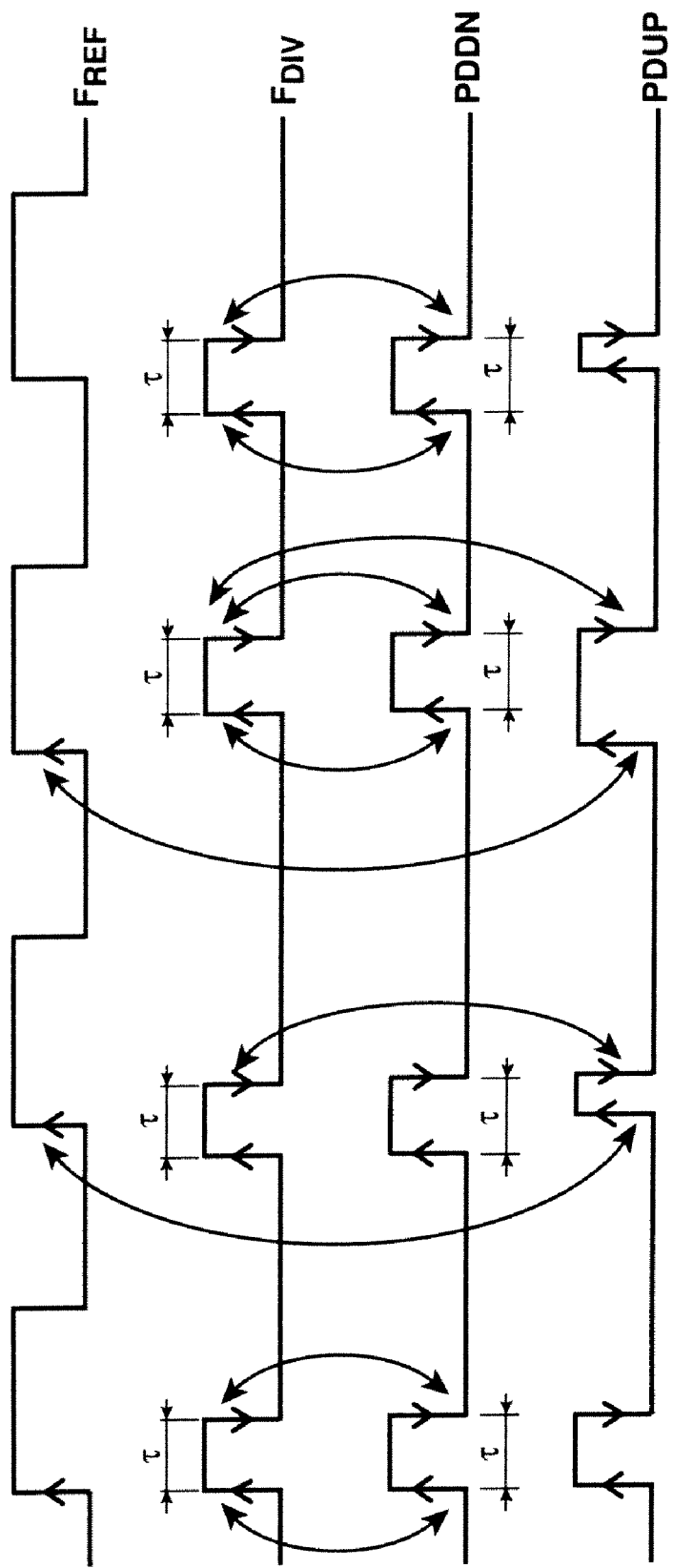
FIG. 12 is a timing diagram for the fractional-N phase locked loop of FIG. 3A using the ÷⅔ cell stage of FIG. 5B.

FIG. 12 shows the timing diagram of the frac-N PLL circuit in FIG. 3A using the ÷⅔ cell stage 502 of FIG. 5B. The PDDN signal is on for on time τ given by the on time of frequency divisional signal $F_{DIV}$. The PDUP signal is on for time varying time every clock cycle. Thus, the signals PDUP and PDDN depend on $F_{REF}$ and $F_{DIV}$. The arrows in FIG. 12 show synchronization between various rising edges of different signals. For example, in the illustrated example, the PDUP signal has a rising edge that is synchronized with the rising edge of $F_{REF}$ and a falling edge that is synchronized with the falling edge of $F_{DIV}$, thus resulting in a varying on time. In contrast, the PDDN signal is synchronized completely with $F_{DIV}$.

FIGS. 13A-13F, illustrate various devices in which a delta-sigma controlled fractional-N synthesizer may be employed.

Figure 13A:
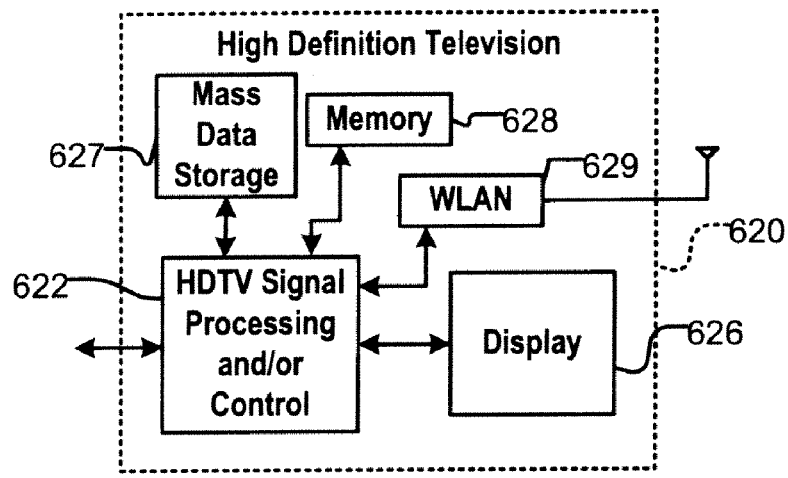
FIGS. 13A-13F illustrate embodiments of circuits that may incorporate a delta-sigma controlled fractional-N synthesizer.

Referring now to FIG. 13A, such techniques may be utilized in a high definition television (HDTV) 620. HDTV 620 includes a mass data storage 627, an HDTV signal processing and control block 622, a WLAN interface and memory 628. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with a mass data storage 627 that stores data in a nonvolatile manner such as optical and/or magnetic storage devices. The mass storage device may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629. Both the HDTV signal processor 622 and the WLAN network interface 629 may use a delta-sigma controlled fractional-N synthesizer.

Figure 13B:
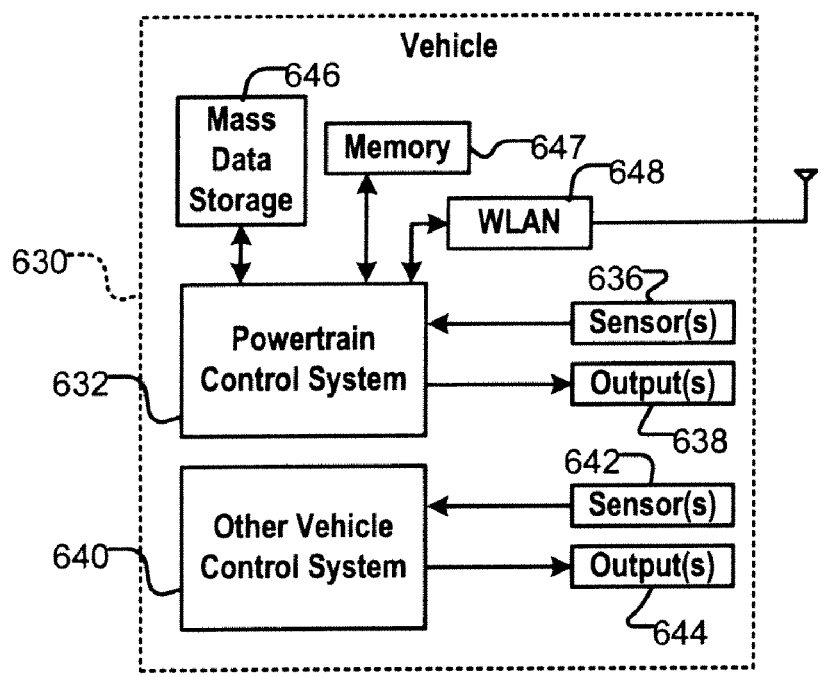

Referring now to FIG. 13B, such techniques may be utilized in a vehicle 630. The vehicle 630 includes a control system that may include mass data storage 646, as well as a WLAN interface 648. The mass data storage 646 may support a powertrain control system 632 that receives inputs from one or more sensors 636 such as temperature sensors, pressure sensors, rotational sensors, airflow sensors and/or any other suitable sensors and/or that generates one or more output control signals 638 such as engine operating parameters, transmission operating parameters, and/or other control signals.

Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like.

Powertrain control system 632 may communicate with mass data storage 627 that stores data in a nonvolatile manner such as optical and/or magnetic storage devices. The mass storage device 646 may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The control system 640 may also include mass data storage, memory and/or a WLAN interface (all not shown). In one exemplary embodiment, the WLAN network interface 648 may implement delta-sigma controlled fractional-N synthesizer.

Figure 13C:
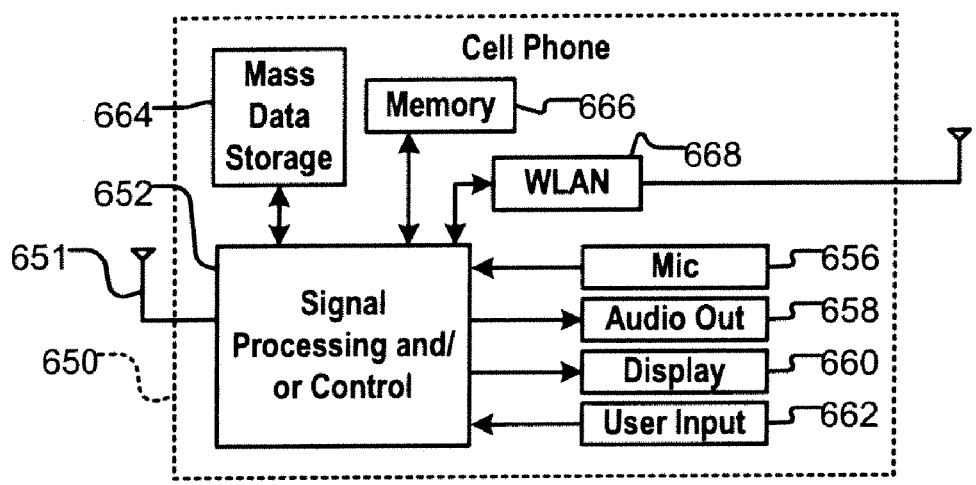

Referring now to FIG. 13C, such techniques may be used in a cellular phone 650 that may include a cellular antenna 651. The cellular phone 650 may include either or both signal processing and/or control circuits, which are generally identified in FIG. 13C at 652, a WLAN network interface 668 and/or mass data storage 664 of the cellular phone 650. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions. The signal processing and control circuits 652 may employ a delta-sigma controlled fractional-N synthesizer.

Cellular phone 650 may communicate with mass data storage 664 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668 may implement delta-sigma controlled fractional-N synthesizer.

Figure 13D:
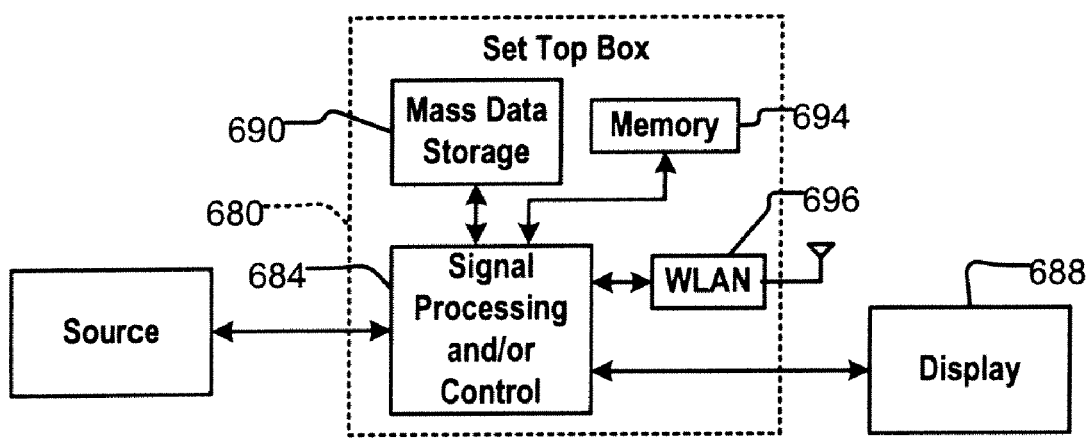

Referring now to FIG. 13D, such techniques may be utilized in a set top box 680. The set top box 680 may include either or both signal processing and/or control circuits, which are generally identified in FIG. 13D at 684, a WLAN interface and/or mass data storage 690 of the set top box 680. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function. The signal processing and control circuits 684 may employ a delta-sigma controlled fractional-N synthesizer.

Set top box 680 may communicate with mass data storage 690 that stores data in a nonvolatile manner and may use jitter measurement. Mass data storage 690 may include optical and/or magnetic storage devices for example hard disk drives HDD and/or DVDs. The HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696. The WLAN network interface may implement delta-sigma controlled fractional-N synthesizer.

Figure 13E:
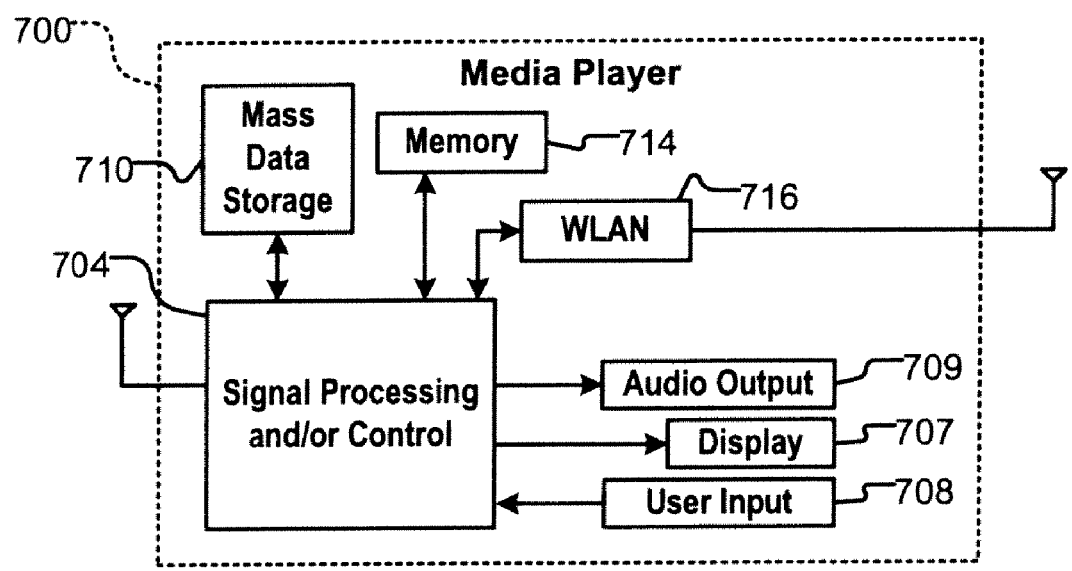

Referring now to FIG. 13E, such techniques may be used in a media player 700. The media player 700 may include either or both signal processing and/or control circuits, which are generally identified in FIG. 13E at 704, a WLAN interface and/or mass data storage 710 of the media player 700. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner and may utilize jitter measurement. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 700 may be connected to memory 714 such as RAM, ROM, low latency nonvolatile memory such as flash memory and/or other suitable electronic data storage. Media player 700 also may support connections with a WLAN via a WLAN network interface 716. The WLAN network interface 716 and/or signal processing circuits 704 may implement delta-sigma controlled fractional-N synthesizer.

Figure 13F:
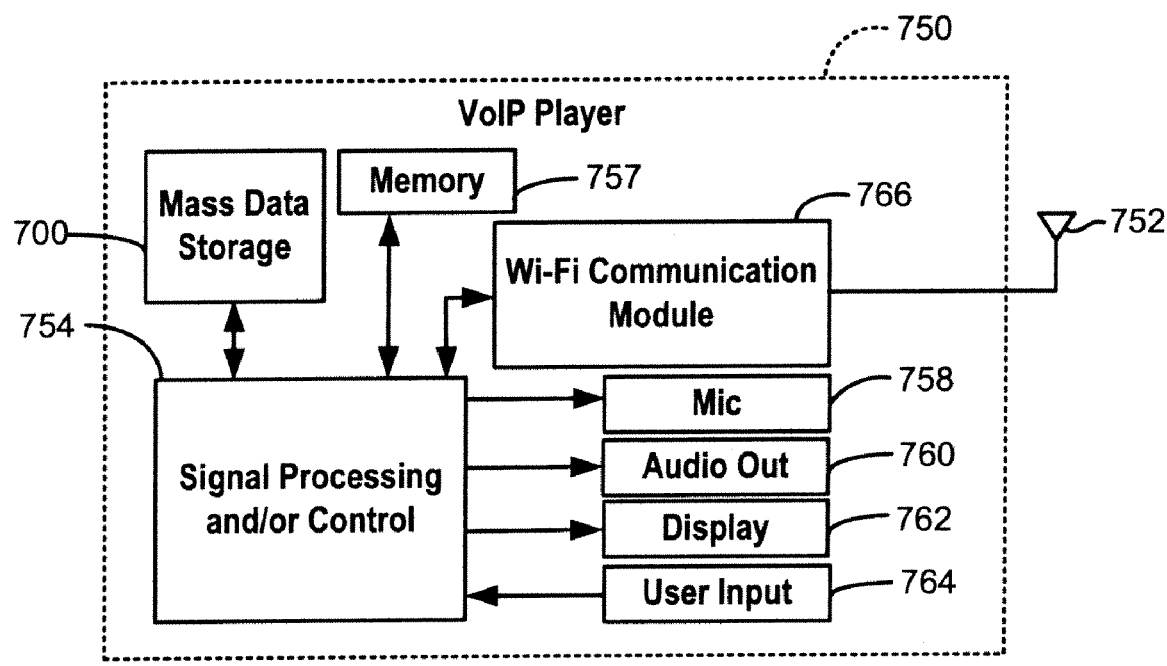

Referring to FIG. 13F, such techniques may be utilized in a Voice over Internet Protocol (VoIP) phone 750 that may include an antenna 752. The VoIP phone 750 may include either or both signal processing and/or control circuits, which are generally identified in FIG. 13F at 754, a wireless interface and/or mass data storage of the VoIP phone 750. In some implementations, VoIP phone 750 includes, in part, a microphone 758, an audio output 760 such as a speaker and/or audio output jack, a display monitor 762, an input device 764 such as a keypad, pointing device, voice actuation and/or other input devices, and a Wireless Fidelity (WiFi) communication module 766. Signal processing and/or control circuits 754 and/or other circuits (not shown) in VoIP phone 750 may process data, perform coding and/or encryption, perform calculations, format data and/or perform other VoIP phone functions.

VoIP phone 750 may communicate with mass data storage 756 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 750 may be connected to memory 757, which may be a RAM, ROM, low latency nonvolatile memory such as flash memory and/or other suitable electronic data storage. VoIP phone 750 is configured to establish communications link with a VoIP network (not shown) via WiFi communication module 766. The WiFi communication module 766 may implement delta-sigma controlled fractional-N synthesizer when communicating data via the WiFi communication module 766 or via the audio output 760 in communication with an accessory, such as a Bluetooth headset (not depicted).

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A transmitter circuit for converting an input clock signal to an output clock signal, the transmitter circuit comprising:
   a signal processing circuit to produce the input clock signal and to produce parallel streams of data; and
   a clock multiplier circuit to convert the input clock signal to the output clock signal, the clock multiplier circuit comprising,
   a first circuit to detect a frequency and phase of the input clock signal and produce a voltage control signal,
   a voltage control oscillator to receive the voltage control signal and produce the output clock signal, and
   a multi-modulus frequency divider circuit to receive the output clock signal in a feedback configuration and produce a frequency division signal to drive the first circuit, where the frequency division signal has an on-time independent of a division ratio of the multi-modulus divider circuit, and where the frequency division signal is a modulus output signal of the multi-modulus frequency divider circuit.

2. The transmitter circuit of claim 1, wherein the multi-modulus divider circuit comprises a plurality of divider cell stages coupled to provide an output of one divider cell stage as an input to another divider cell stage.

3. The transmitter circuit of claim 2, wherein each of the plurality of divider cell stages produces a modulus output signal having an on-time independent of the division ratio of the multi-modulus divider circuit.

4. The transmitter circuit of claim 2, wherein one of the plurality of divider cell stages produces the frequency division signal as its respective modulus output signal.

5. The transmitter circuit of claim 2, wherein each of the plurality of divider cell stages is a divider cell stage capable of dividing by either 2 or 3.

6. The transmitter circuit of claim 2, further comprising:
   a delta-sigma modulator to produce a fractional output signal; and
   a summer circuit coupled to receive the fractional output signal and an input signal indicating a value for an integer N and to produce a fractional division ratio as an output signal coupled to each of the plurality of divider cell stages.

7. The transmitter circuit of claim 6, wherein the delta-sigma modulator is coupled to receive the input clock signal.

8. The transmitter circuit of claim 1, where the multi-modulus divider circuit is a fractional-N divider circuit having a fractional instantaneous division ratio.

9. The transmitter circuit of claim 1, where the multi-modulus divider circuit is a fractional-N divider circuit having an integer instantaneous division ratio.

10. A clock multiplier circuit for converting an input clock signal to an output clock signal, the clock multiplier circuit comprising:
    a phase detector circuit to receive the input clock signal;
    a frequency detector circuit to receive the input clock signal, where the phase detector circuit and the frequency detector circuit are coupled to a frequency generator circuit to produce the output clock signal; and
    a multi-modulus divider circuit coupled to receive the output clock signal in a feedback manner and to produce a frequency division signal having an on-time independent of a division ratio of the multi-modulus divider circuit, where the frequency division signal is a modulus output signal of the multi-modulus divider circuit, and where the multi-modulus divider circuit is coupled to provide the frequency division signal to the phase detector circuit and the frequency detector circuit.

11. The clock multiplier circuit of claim 10, wherein the multi-modulus divider circuit comprises a plurality of divider cell stages coupled in series to provide the output of one divider cell stage as the input to another divider cell stage.

12. The clock multiplier circuit of claim 11, wherein each of the plurality of divider cell stages produces a modulus output signal having an on-time independent of the division ratio of the multi-modulus divider circuit.

13. The clock multiplier circuit of claim 12, wherein one of the plurality of divider cell stages produces the frequency division signal as its respective modulus output signal.

14. The clock multiplier circuit of claim 11, wherein each of the plurality of divider cell stages is a divider cell stage capable of dividing by either 2 or 3.

15. The clock multiplier circuit of claim 11, further comprising:
   a delta-sigma modulator to produce a fractional output signal; and a summer circuit coupled to receive the fractional output signal and an input signal indicating a value for an integer N and to produce a fractional division ratio as an output signal coupled to each of the plurality of divider cell stages.

16. The clock multiplier circuit of claim 10, further comprising:
   a phase detection charge pump circuit coupled to the phase detector circuit to produce a phase detection circuit current signal; and
   a frequency detection charge pump circuit coupled to the frequency detector circuit to produce a frequency detection circuit current signal.

17. The clock multiplier circuit of claim 16, wherein the frequency generator circuit is a voltage controlled oscillator, the clock multiplier circuit further comprising:
   a phase detection filter to convert the phase detection circuit current signal to a voltage to control the voltage controlled oscillator; and
   a frequency detection filter to convert the frequency detection circuit current signal to a voltage to control the voltage controlled oscillator.

18. The clock multiplier circuit of claim 17, further comprising a summer circuit to sum the voltage from the phase detection filter with the voltage from the frequency detection filter.

19. The clock multiplier circuit of claim 10, where the multi-modulus divider circuit is a fractional-N divider circuit having a fractional instantaneous division ratio.

20. The clock multiplier circuit of claim 10, where the multi-modulus divider circuit is a fractional-N divider circuit having an integer instantaneous division ratio.

21. A clock multiplier circuit for converting an input clock signal to an output clock signal, the clock multiplier circuit comprising:
   a first circuit dedicated to detect a phase of the input clock signal;
   a second circuit dedicated to detect a frequency of the input clock signal;
   a third circuit coupled to the first circuit and the second circuit to produce the output clock signal; and
   a multi-modulus divider circuit coupled to receive the output clock signal in a feedback manner and to produce a frequency division signal having an on-time independent of a division ratio of the multi-modulus divider circuit, where the frequency division signal is a modulus output signal of the multi-modulus divider circuit, and where the multi-modulus divider circuit is coupled to provide the frequency division signal to the phase detector circuit and the frequency detector circuit.

22. The clock multiplier circuit of claim 21, wherein the first circuit is to produce a first output signal to drive a first charge pump circuit and the second circuit is to produce a second output signal to drive a second charge pump circuit.

23. The clock multiplier circuit of claim 22, wherein the first charge pump circuit and the second charge pump are coupled to control a voltage controlled oscillator of the third circuit to produce the output clock signal.

24. The clock multiplier circuit of claim 23, wherein the first charge pump circuit is coupled to a first filter circuit for producing a first voltage control signal and wherein the second charge pump circuit is coupled to a second filter circuit for producing a second voltage control signal, each of the first voltage control signal and the second voltage control signal are coupled to a summing circuit to control the voltage controller oscillator.

25. The clock multiplier circuit of claim 23, wherein the multi-modulus divider circuit comprises a plurality of divider cell stages coupled in series to provide the output of one divider cell stage as the input to another divider cell stage.

26. The clock multiplier circuit of claim 25, wherein each of the plurality of divider cell stages produces a modulus output signal having an on-time independent of the division ratio of the multi-modulus divider circuit.

27. The clock multiplier circuit of claim 26, wherein one of plurality of divider cell stages produces the frequency division signal as its respective modulus output signal.

28. The clock multiplier circuit of claim 26, wherein each of the plurality of divider cell stages is a divider cell stage capable of dividing by either 2 or 3.

29. The clock multiplier circuit of claim 26, further comprising a sixth circuit to produce the division ratio signal and couple the division ratio signal to each of the plurality of divider cell stages.

30. The clock multiplier circuit of claim 26, wherein the on-time of the modulus output signal of one of the plurality of divider cell stages is the round trip time for the clock multiplier circuit.

31. The clock multiplier circuit of claim 21, where the multi-modulus divider circuit is a fractional-N divider circuit having a fractional instantaneous division ratio.

32. The clock multiplier circuit of claim 21, where the multi-modulus divider circuit is a fractional-N divider circuit having an integer instantaneous division ratio.

33. A method for converting an input frequency signal to an output frequency signal, the method comprising:
   detecting a phase of the input frequency signal;
   detecting a frequency of the input frequency signal;
   producing the output frequency signal;
   coupling the output frequency signal into a multi-modulus divider circuit receiving a division ratio signal;
   in the multi-modulus divider circuit, dividing the output frequency signal to produce a frequency division signal having an on-time that is independent of the division ratio signal, where the frequency division signal is a modulus output signal of the multi-modulus divider circuit; and
   providing the frequency division signal in a feedback manner to control the detecting of the phase of the input frequency signal and to control the detecting of the frequency of the input frequency signal.

34. The method of claim 33, wherein coupling the output frequency signal into a multi-modulus divider circuit comprises coupling the output frequency signal into a first one of a plurality of divider cell stages coupled in series each providing an output as an input to another divider cell stage.

35. The method of claim 34, further comprising producing the frequency division signal as an output from one of the plurality of divider cell stages.

36. The method of claim 35, further comprising configuring the plurality of divider cell stages such that one of the plurality of divider cell stages produces an output having an on-time that corresponds to the round trip time for locking the output frequency signal to the input frequency signal.

37. The method of claim 36, further comprising coupling a division ratio signal to each of the plurality of divider cell stages.

38. The method of claim 33, wherein the multi-modulus divider circuit is a fractional-N divider circuit having a fractional instantaneous division ratio.

39. The method of claim 33, wherein the multi-modulus divider circuit is a fractional-N divider circuit having an integer instantaneous division ratio.

40. The method of claim 33, wherein the modulus output signal is independent of the order, topology and clock frequency of a delta-sigma modulator connected to the multi-modulus divider circuit.

* * * * *